(12) United States Patent
Smith

(10) Patent No.: US 6,817,923 B2
(45) Date of Patent: Nov. 16, 2004

(54) CHEMICAL MECHANICAL PROCESSING SYSTEM WITH MOBILE LOAD CUP

(75) Inventor: Christopher W. Smith, Los Altos Hills, CA (US)

(73) Assignee: Applied Materials, Inc., Santa Clara, CA (US)

(*) Notice: Subject to any disclaimer, the term of this patent is extended or adjusted under 35 U.S.C. 154(b) by 279 days.

(21) Appl. No.: 09/865,852

(22) Filed: May 24, 2001

(65) Prior Publication Data

US 2002/0177386 A1 Nov. 28, 2002

(51) Int. Cl.[7] .............................................. B24B 49/00
(52) U.S. Cl. ........................................ 451/5; 451/288
(58) Field of Search ................................ 451/5, 11, 24, 451/72, 66, 67, 288, 334

(56) References Cited

U.S. PATENT DOCUMENTS

| | | | | |
|---|---|---|---|---|
| 5,738,574 A | | 4/1998 | Tolles et al. ................ | 451/288 |
| 5,934,984 A | * | 8/1999 | Togawa et al. ............. | 451/288 |
| 6,036,582 A | | 3/2000 | Aizawa et al. ............... | 451/41 |
| 6,062,954 A | * | 5/2000 | Izumi .......................... | 451/72 |

OTHER PUBLICATIONS

Birang et al. "Apparatus for Transferring Semiconductor Substrates Using an Input Module" U.S. patent application Ser. No. 09/583,507, filed May 31, 2000.
Birang et al. "Apparatus and Methods for Chemical Mechanical Polishing with an Advanceable Polishing Sheet" U.S. patent application Ser. No. 09/144,456, filed Feb. 4, 1999.

* cited by examiner

Primary Examiner—Robert A. Rose
(74) Attorney, Agent, or Firm—Moser, Patterson & Sheridan

(57) ABSTRACT

Generally, a system and method for processing a substrate is provided. In one embodiment, a system for processing a substrate comprising a polisher, a first motion device, a second motion device and a load cup. The polisher has one or more polishing heads and one or more platens. The polishing heads are adapted to retain the substrate against the platens during processing and provide motion therebetween. The first motion device is disposed proximate the polisher's first side and moves along the first side between at least a first position and a second position. The second motion device is coupled to the first motion device and the load cup. The second motion device moves the load cup between at least a first position that is adjacent the first side and a second position that is inward of the first side.

48 Claims, 13 Drawing Sheets

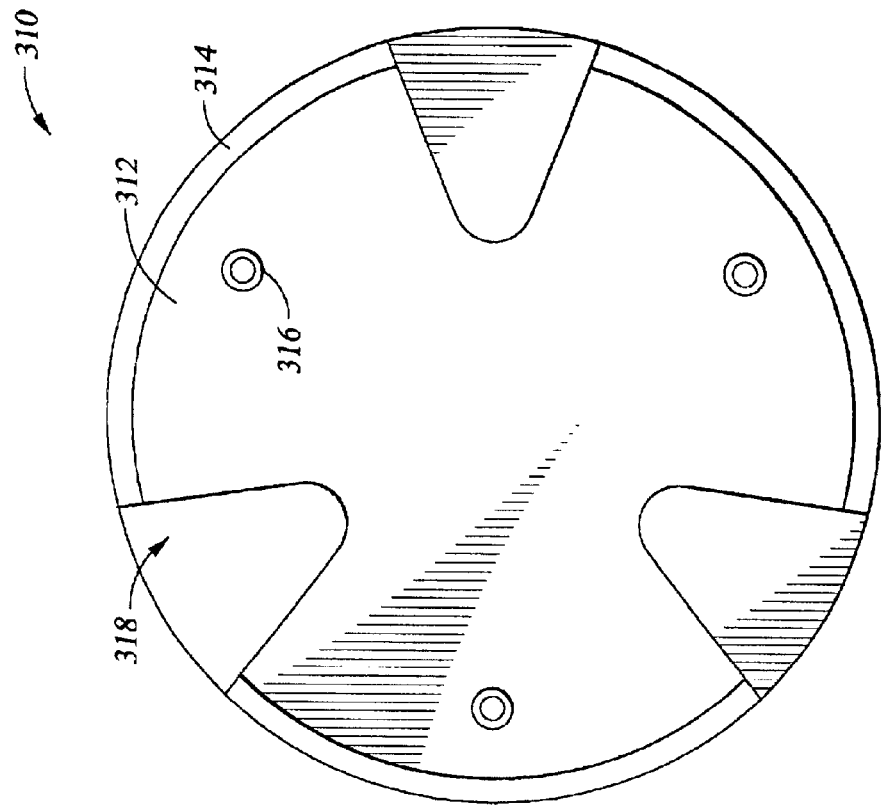
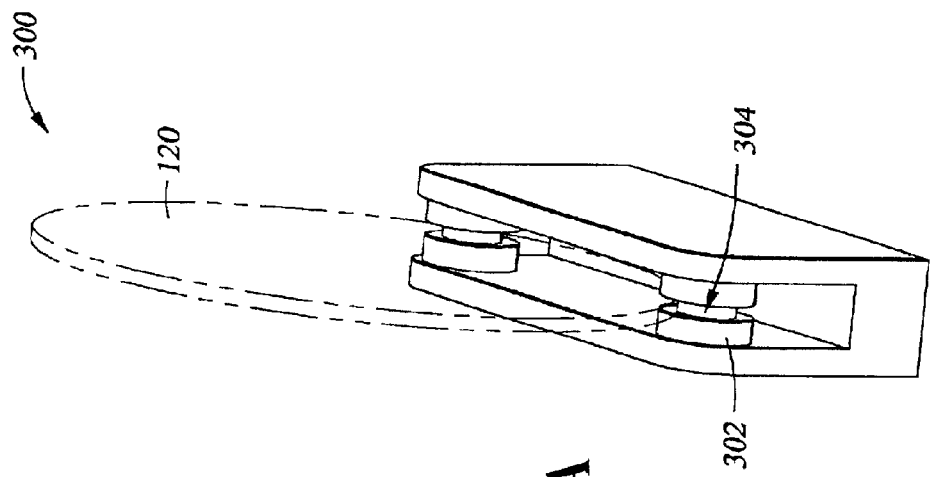
Fig. 3B
Fig. 3A

US 6,817,923 B2

CHEMICAL MECHANICAL PROCESSING SYSTEM WITH MOBILE LOAD CUP

BACKGROUND OF THE DISCLOSURE

1. Field of Invention

Embodiments of the invention relate generally to a system and method for chemical mechanical polishing.

2. Background of Invention

In semiconductor wafer processing, the use of chemical mechanical planarization, or CMP, has gained favor due to the enhanced ability to increase device density on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

An exemplary CMP system that addresses these issues is described in U.S. Pat. No. 5,804,507, issued Apr. 15, 1998 by Tolles et al., which is incorporated herein by reference in its entirety. Tolles et al. discloses a CMP system having a planarization system that is supplied wafers from cassettes located in an adjacent liquid filled bath. A transfer mechanism, or robot, facilitates the transfer of the wafers from the bath to a transfer station. The transfer station generally contains a load cup that positions wafers into one of four processing heads mounted to a carousel. The carousel moves each processing head sequentially over the load cup to receive a wafer. As the processing heads are loaded, the carousel moves the processing heads and wafers through the planarization stations for polishing. The wafers are planarized by moving the wafers relative to a polishing material in the presence of polishing fluid. The polishing fluid typically contains chemicals that aid in the removal of material from the wafer. The mechanical aspect of the polishing process is generally provided by abrasives disposed either in the polishing fluid (i.e., slurry) or disposed on the polishing material. After completion of the planarization process, the wafer is returned back through the transfer station to the proper cassette located in the bath.

As increased numbers of integrated circuit fabrication schedules include one or more chemical mechanical planarization steps, demand for chemical mechanical polishing tools having greater wafer throughput and decreased cost of ownership has become paramount. Thus, tools having small footprints and high production capacity while minimizing defects rates are in great need.

Therefore, there is a need for an improved chemical mechanical polishing system.

SUMMARY OF INVENTION

One aspect of the invention generally provides a system for processing a substrate. In one embodiment, a system for processing a substrate comprising a polisher, a first motion device, a second motion device and a load cup is described. The polisher has one or more polishing heads and one or more platens. The polishing heads are adapted to retain the substrate against the platens during processing and provide motion therebetween. The first motion device is disposed proximate the polisher's first side and moves along the first side between at least a first position and a second position. The second motion device is coupled to the first motion device and the load cup. The second motion device moves the load cup between at least a first position that is adjacent the first side and a second position that is inward of the first side.

In another embodiment, a system of processing comprises a polisher, a first motion device, a first load cup, a second motion device, a second load cup. The polisher has one or more polishing heads and one or more platens. The polishing heads are adapted to retain the substrate against the platens during processing and provide motion therebetween. The first motion device is disposed adjacent the polisher's first side and is movable along the first side of the polisher. The first load cup is coupled to the first motion device. The second motion device is disposed adjacent the polisher's second side. The second side of the polisher is orientated opposite the first side. The second motion device has the second load cup coupled thereto and is movable along the second side of the polisher.

In another aspect of the invention, method for chemical mechanical polishing is provided. In one embodiment, the method includes the steps of transferring the substrate into a first load cup located in a first position, moving the first load cup proximate a first side of the polisher to a second position, moving the first load cup to a third position inward of the second position, and transferring the substrate from the first load cup in the third position to the polishing head. In another embodiment, the method includes transferring a first substrate in a first load cup from a first side of the polisher towards a first polishing station, transferring the first substrate to a first polishing head that is supported by a first carousel, polishing the first substrate on the first polishing station, transferring the first substrate while retained in the first polishing head to a second polishing station, polishing the first substrate on the second polishing station, transferring the first substrate to a second load cup, transferring the first substrate in the second load cup away from the second polishing station towards a second side of the polisher that is opposite the first side.

BRIEF DESCRIPTION OF DRAWINGS

The teachings of the present invention can be readily understood by considering the following detailed description in conjunction with the accompanying drawings, in which:

FIG. 3A is a sectional view of one embodiment of an input module;

FIG. 3B is a plan view of another embodiment of an input module;

To facilitate understanding, identical reference numerals have been used, where possible, to designate identical elements that are common to the figures.

DETAILED DESCRIPTION OF INVENTION

Figure 1A:
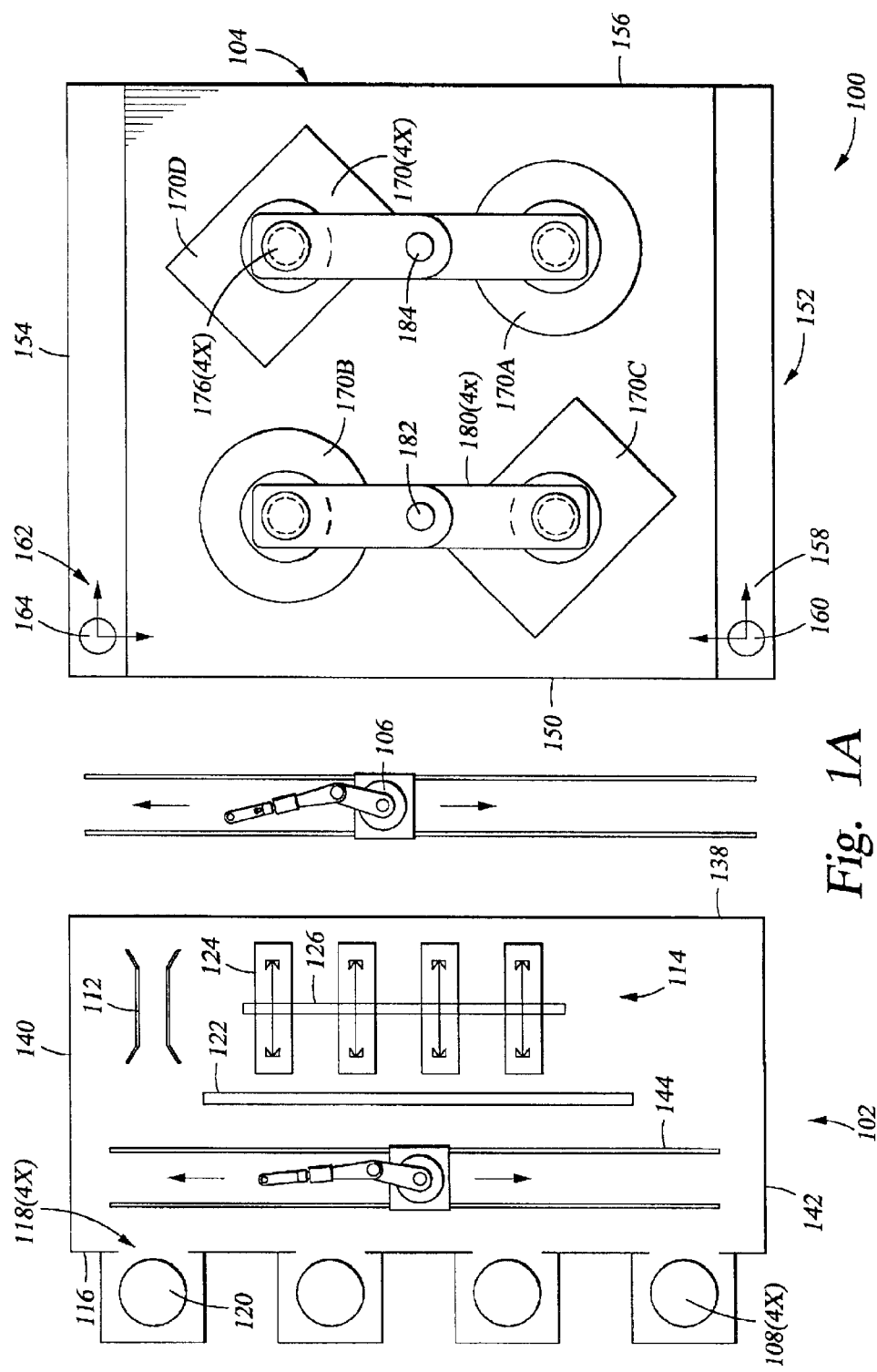
FIG. 1A is a plan view of one embodiment of a chemical mechanical polishing system of the invention.
Figure 2:
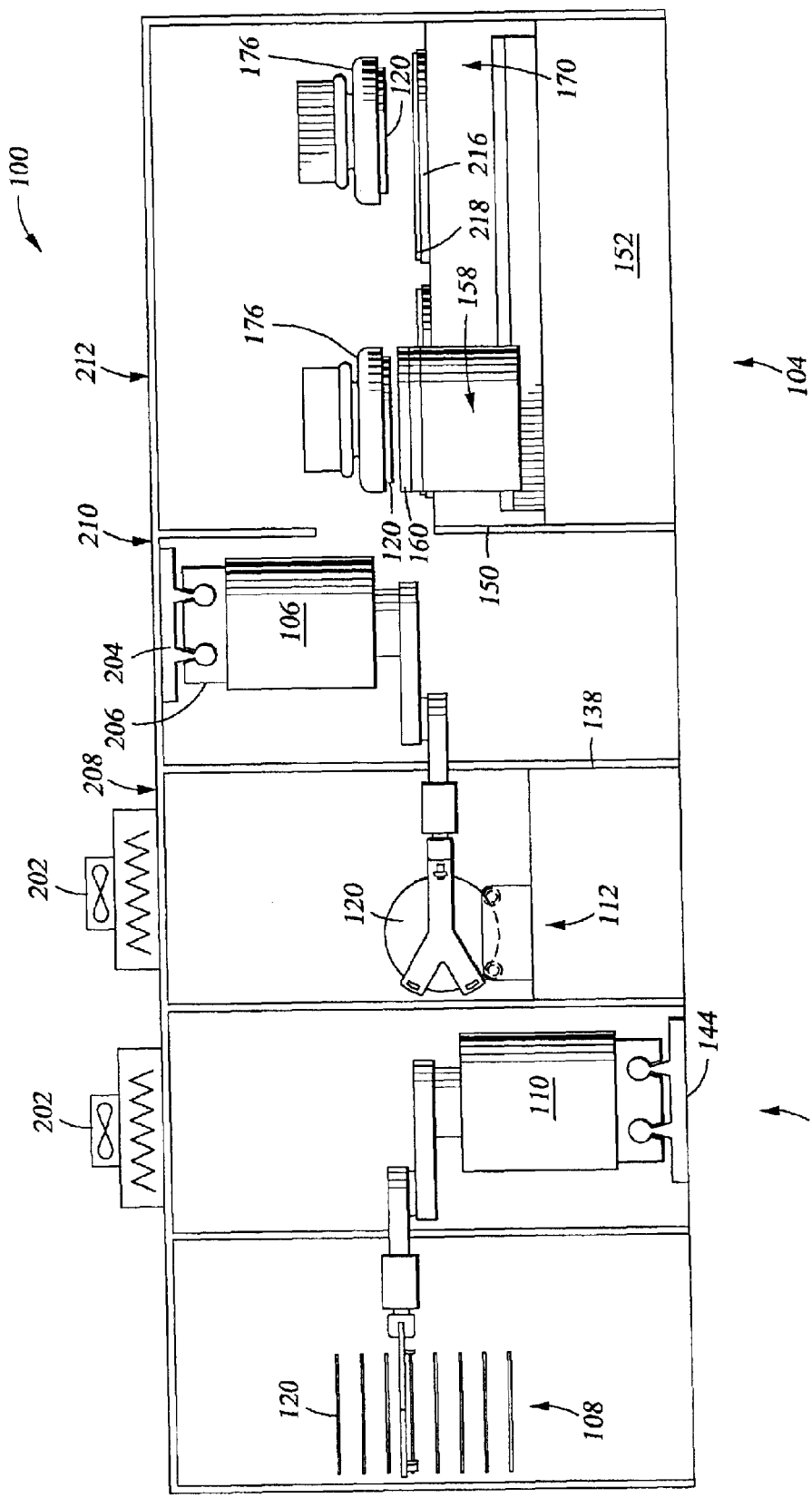
FIG. 2 is an elevation of the polishing system of FIG. 1A.

FIGS. 1A and 2 depict plan and side views of one embodiment of a chemical mechanical polishing system 100. Referring simultaneously to FIGS. 1A and 2, the system 100 generally includes a modular factory interface 102 and a polisher 104. Substrates 120 processed on the system 100 are passed between the factory interface 102 and the polisher 104 by a substrate handler 106 and a pair of movable load cups 160, 162.

The factory interface 102 and the polisher 104 each have an enclosure 208, 210, respectively, to minimize contamination of the substrates 120 processed therein. Typically, the substrate handler 106 is enclosed in a third enclosure 212 to maintain a clean environment through with substrates 120 are passed between the factory interface 102 and the polisher 104. Generally, the environment of the factory interface 102 is maintained at a cleaner level and higher pressure than the other environments to prevent substrates 120 that have been processed and optionally cleaned from becoming contaminated. Typically, high efficiency (HEPA) air filters 134, such as those available from Camfil-Farr, of Riverdale, N.J., are coupled to the enclosure and provide filtered air to the system 100.

The factory interface 102 generally includes a substrate transfer corridor 136, an input module 112 and a cleaner 114. Optionally, the factory interface 102 may include an integrated metrology device (not shown) to monitor the results of the polishing process. The metrology device may be, for example, a film thickness metrology device or a particle monitoring device. The factory interface 102 generally has a first side 116, a second side 138, a third side 140 and a fourth side 142. The second side 138 is typically opposite the first side 116 and is disposed adjacent the polisher 104. The first side 116 generally includes a plurality of bays 118. Each bay is configured to accept one of a plurality of substrate storage cassettes 108 that are interfaced with the factory interface 104. The substrate storage cassettes 108 generally store the substrates 120 before and after processing. The substrate transfer corridor 136 is defined between the first side 116 and a center wall 122. A factory interface robot 110 is generally disposed within the substrate transfer corridor 136 and provides for substrate transfer between the cleaner 114, the cassettes 108 and the input module 112.

The factory interface robot 110 generally may be any of a variety of robots having the range of motion to transfer substrates 120 between the cassettes 108, input module 112 and the cleaner 114. The factory interface robot 110 may be configured to transfer substrates either horizontally or vertically. In one embodiment, the factory interface robot 110 has an edge contract gripper that allows the robot move the substrate 120 without slippage or damage to the substrate's surface. Other types of grippers may be used, for example, electrostatic chucks, mechanically clamps and vacuum grippers. Generally, the factory interface robot 110 is mounted to a rail 144 that is disposed in the transfer corridor 136 between the bays 118 and cleaner 114. An example of a factory interface robot 110 is a 4-Link robot, manufactured by Kensington Laboratories, Inc., Richmond, Calif.

The cleaner 114 is generally disposed proximate the second side 138 adjacent to the polisher 104. The center wall 122 is disposed between the first and second sides 116, 138 to separate the cleaner 114 from the factory interface robot 110, thus preventing contamination from passing between the cleaner 114 and substrate transfer corridor 136 of the factory interface 102.

The cleaner 114 generally receives substrates 120 returning from the polisher 104. The cleaner 114 generally includes a series of modules 124 that may include brushes, baths, fluid jets, megasonic and other cleaning processes that remove slurry and other contaminants from the substrates surface. In one embodiment, a walking beam 126 places the substrates 120 sequentially through the cleaning modules 124. Upon leaving the last module 124 of the cleaner 114, the cleaned substrate 120 is retrieved from the cleaner 114 by the factory interface robot 110 and returned to one of the substrate storage cassettes 108. An example of such a cleaner 114 is described in U.S. patent application Ser. No. 09/558,815, filed Apr. 26, 2000, by Brown et al., and is incorporated herein in its entirety. Other cleaners may alternatively be used. Another cleaner 114 that may be adapted to benefit from the invention is a MESA™ wafer cleaner, available from Applied Materials, Inc., of Santa Clara, Calif.

The input module 112 generally serves as a staging platform to facilitate transfer of the substrates 120 between the factory interface robot 110 and the substrate handler 106. Substrates retrieved from the cassettes 108 by the factory interface robot 110, are placed in the input module 112 where they may be transferred to the polisher 104 by the substrate handler 106. Substrates may be queued horizontally or vertically between the factory interface 102 and the polisher 104 in the input mode 112 or in an optional input buffer 128.

The optional input buffer 128 may be disposed proximate the input module 112. The input buffer 128 allows substrates 120 to be queued for transfer to the polisher 104. Thus, substrates 120 queued in the buffer 128 are available for transfer to the polisher 104 if substrates are temporarily unavailable from the cassettes 108. Moreover, if polished substrates exiting the polisher 104 cannot be placed in the cleaner 114 or input module 112, those substrates may be temporarily placed in the input buffer 128, thus allowing the polisher 104 to continue processing substrates currently disposed thereon without stoppage.

An example of a factory interface 102 in which the invention may be used to advantage is generally described in U.S. patent application Ser. No. 09/547,189, filed Apr. 11, 2000 by Ettinger et al., which is hereby incorporated herein by reference in its entirety. It is understood that the invention may incorporate other factory interfaces having alternative configurations, including systems that load a polisher 104 directly from a storage cassette or interface with another processing system.

FIG. 3A depicts one embodiment of an input module 300 that is configured to maintain the substrate 120 in a substantially vertical orientation. The input module 300 includes at least two pins 302. Each pin 302 has a notch 304 disposed in the pin's circumference. The notch 304 is positioned in the input module 300 so that the substrate 120 may be set vertically in the input module 300 without falling over or rolling out of the module. Alternatively, input modules having other configurations may be utilized.

For example, FIG. 3B depicts another embodiment of an input module 310 that is configured to maintain the substrate in a substantially horizontal orientation. The input module 310 includes a support platform 312 that is circumscribed by a protruding lip 314. The support platform 312 has a plurality of support pins 316 projecting therefrom to maintain the substrate in a spaced-apart relation to the platform 312, thus minimizing contamination generation and transfer. The lip 314 generally extends beyond the pins 316 to prevent lateral movement of the substrate. A plurality of cut-outs 318 are defined in the support platform's perimeter and lip 314. The cut-outs 318 are configured to allow the gripper fingers of the factory interface robot 110 and the substrate handler 106 to access the substrate positioned in the input module 310.

Returning to FIGS. 1A and 2, substrate handler 106 generally may comprise any number of robots having a range of motion that enables the transfer of substrates 120 between the input module 112 of the factory interface 102 and the polisher 104. The substrate handler 106 may be coupled to the factory interface 102, the polisher 104 or be free standing. In the embodiment depicted in FIGS. 1A and 2, the substrate handler 106 is suspended from the third enclosure 212 between the factory interface 102 and polisher 104. The substrate handler 106 generally is disposed on a guide that controllably slides along a rail that is coupled to the enclosure. In such a configuration, the range of motion of the substrate handler 106 is maximized while utilizing a smaller robot. Typically, the substrate handler 106 is configured similar to the factory interface robot 110. Alternatively, the substrate handler 106 may be positioned within the factory interface 102 or polisher 104.

Figure 4:
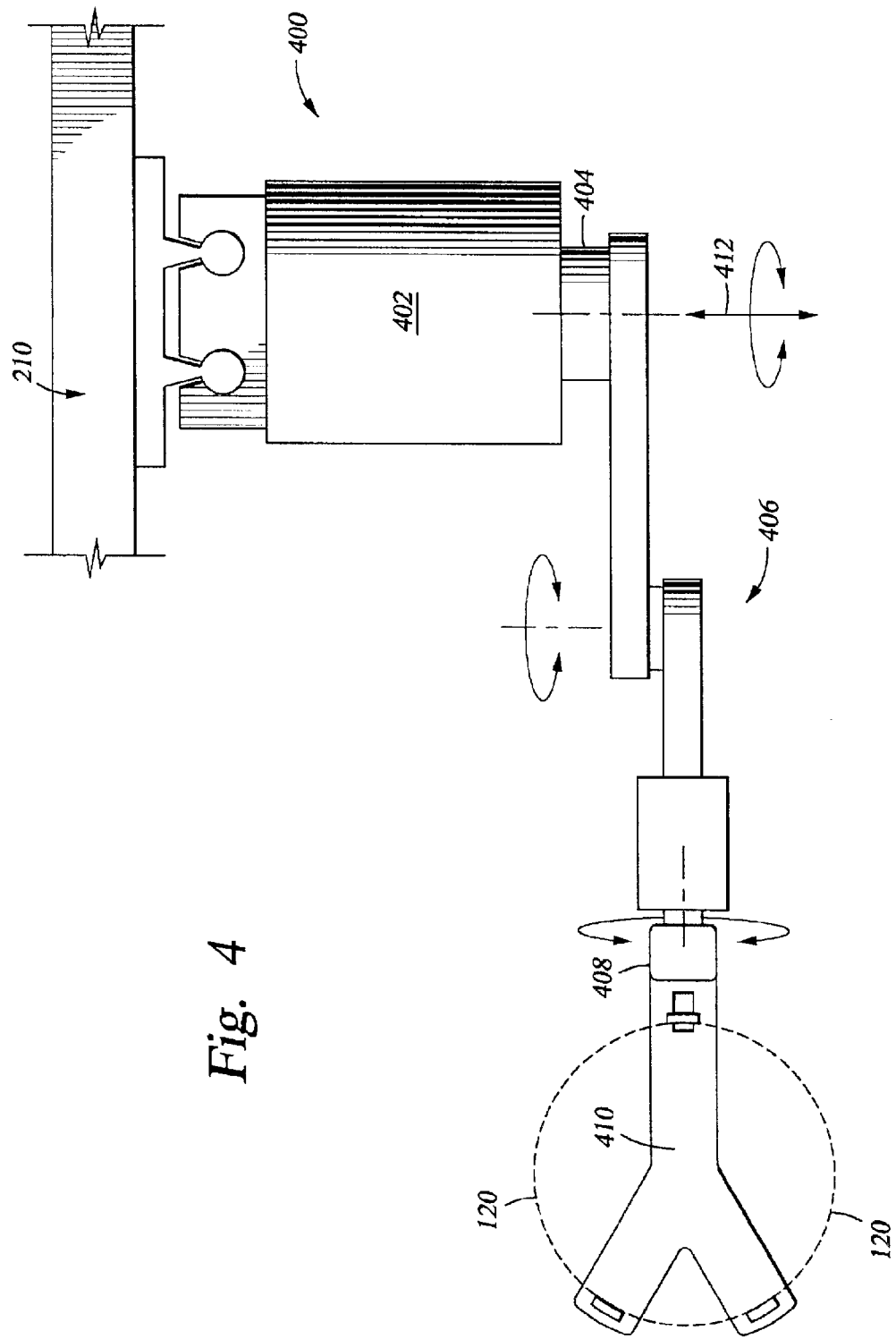
FIG. 4 depicts one embodiment of a substrate handler.

FIG. 4 depicts the exemplary substrate handler 106 that includes a robot base 402, a shaft 404, an articulated arm 406, a rotary actuator 408 and a gripper 410. The robot base 402 is connected to the guide 206. The guide 206 connects the robot base 402 to the railway 204 that permits the substrate handler 106 to travel linearly. The railway 204 may be disposed on factory interface 102, the polisher 104, may be freestanding or may be suspended from the top of the enclosure 210 as shown in FIG. 2. The shaft 404 protrudes from the robot base 402. The shaft 404 is capable of extending and retracting from the robot base 402 as depicted by arrow 412.

The articulated arm 406 is coupled to the shaft 404 at one end and to the rotary actuator 410 at the other. The rotary actuator 408 provides rotary motion to the gripper 410, thus allowing the substrate 120 to be orientated in either a vertical or horizontal position. In one embodiment, the gripper 410 includes at least two fingers that hold the substrate 120 securely by the substrate's perimeter transfer by the substrate handler 106. A gripper having fingers adapted for edge contact gripping is described in U.S. patent application Ser. No. 09/414,771, filed Oct. 6, 1999 by Tobin, which is hereby incorporated herein by reference in its entirety. The factory interface robot 110 may be similarly configured.

Referring back to FIGS. 1A and 2, the polisher 104 is generally disposed proximate the factory interface 102. The polisher 104 has a first side 150, a second side 152, a third side 154 and a fourth side 156. The first side 150 of the polisher 104 is disposed adjacent the second side 138 of the factory interface 102, and is typically oriented parallel thereto.

The polisher 104 generally includes one or more polishing stations 170, a base 172, at least one carousel (shown as a first carousel 182 and a second carousel 184) and one or more polishing heads 176. Each polishing station typically includes a platen 216 that supports a polishing material 218. Although the illustrated polisher 104 includes the platen 216 that rotates in relation to the substrate 120 held in the polishing head 176, other types of polishers that provide other types of relative motion between the substrate and the polishing material may be alternatively utilized.

In one embodiment, the polisher 104 includes a first carousel 182, a second carousel 184 and four polishing stations 170. Each carousel 182, 184 has two arms 180 that each supports one of the polishing heads 176. Each carousel 182, 184 moves the polishing heads 176 coupled thereto between the two adjacent polishing stations 170 that are positioned to either side of the respective carousel 182, 184. For example, a substrate loaded on the polisher 104 from the second side 152 may be retained in the polishing head 176 coupled to the first carousel 182 and processed on the polishing station 170 positioned between the second side 152 of the polisher 104 and the carousel 182. When processing is completed, the first carousel 182 moves the substrate to the polishing station 170 that is positioned between the third side 154 of the polisher 104 and the carousel 182. After processing on that polishing station is completed, the substrate is removed from the polisher 104 from the third side 154. Generally, processing occurs to substrates held in both the polishing heads 176 coupled to the first carousel 182 simultaneously as substrates are sequentially loaded from one side of the polisher 104 and off-loaded from the opposing side. Processing may alternatively occur to a second substrate held by the first carousel 182 in the reverse direction across the polisher 104. The second carousel 184 generally provides for the processing of a third and four substrates in a similar manner.

Figure 1B:
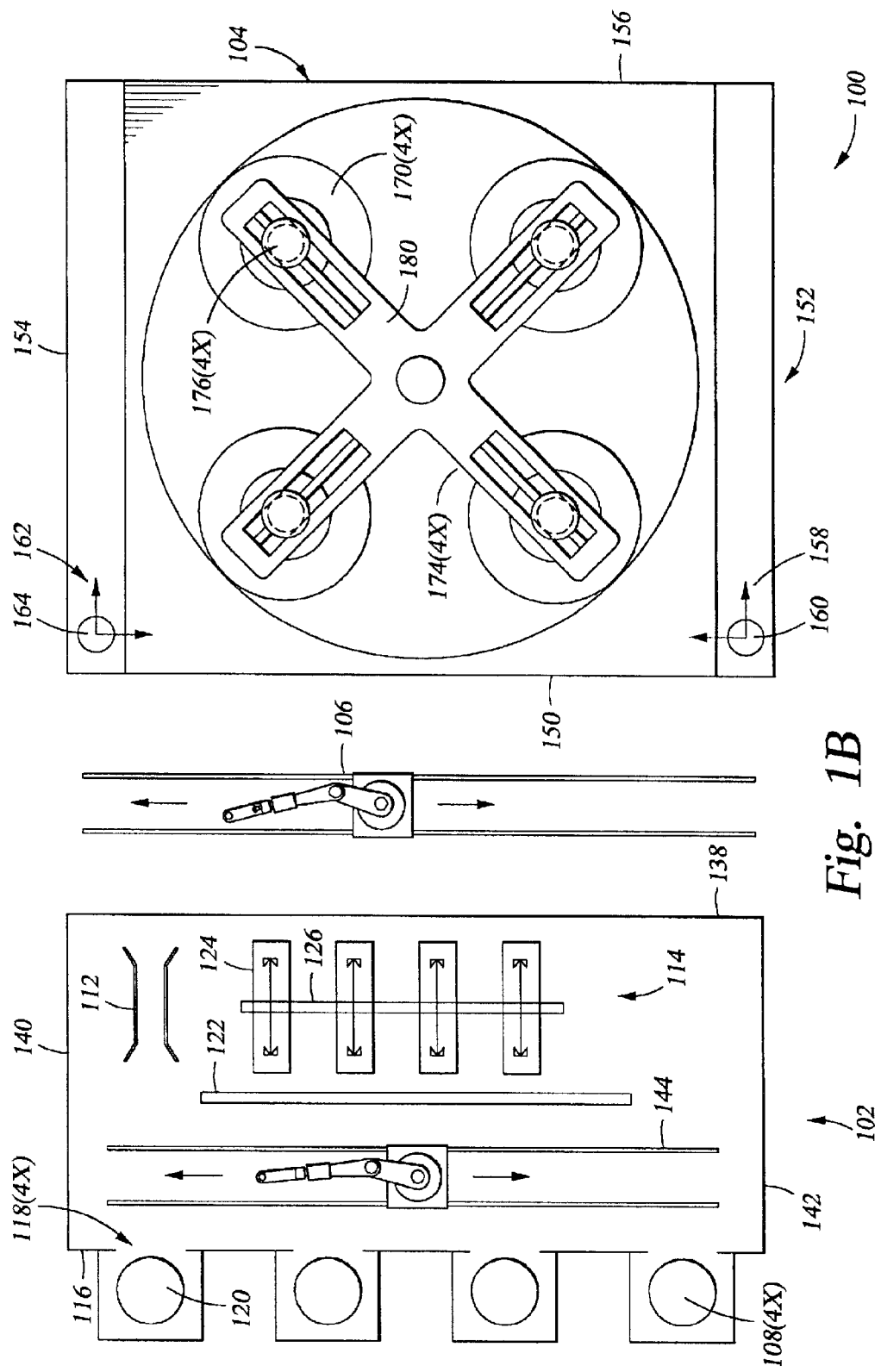
FIG. 1B is a plan view of another embodiment of a chemical mechanical polishing system of the invention.

FIG. 1B depicts another embodiment of system 190 having a single carousel 174 centrally disposed on a polisher 192. Generally, the carousel 174 has a plurality of arms 180 that each support one of the polishing heads 176. The carousel 174 is indexable such that the polishing head 176 may be moved between the polishing stations 170 in either direction. The central position of the carousel 174 allows for multiple polishing stations 170 to be serviced while minimizing the footprint of the polisher 192 and the system 190. A system having a polisher that may be adapted to benefit from the invention is described in U.S. patent application Ser. No. 09/547,189, filed Apr. 11, 2000 by Ettinger et al., which is incorporated herein by reference in its entirety.

Returning to FIGS. 1A and 2, each polishing station 170 generally includes a polishing fluid delivery device (not shown) and a conditioning device (not shown). Generally, the conditioning device periodically conditions the polishing surface of the polishing material 218 to maintain uniform polishing results. During processing, the polishing fluid delivery device provides a polishing fluid, such as de-ionized water or a combination of chemical reagents, to the polishing material 218 so that a chemical mechanical polishing process is performed on the substrate at each polishing station 170.

In one embodiment, the polishing stations 170 include first through fourth polishing stations 170A, 170B, 170C and 170D. The first and third polishing stations 170A, 170C are configured for use with conventional polishing material such as available from Rodel Inc., of Newark, Del., and slurry-based polishing fluid. The second and fourth polishing stations 170B and 170D are configured for use with fixed abrasive polishing material such as available from Minnesota Manufacturing and Mining Company, of Saint Paul, Minn. and a slurry-free polishing fluid.

Other configurations of polishing stations 170 may alternately be utilized. For example, all the polishing stations 170 may be configured for use with convention material or fix abrasive material. The polishing stations 170 may also be configured so that only one polishing station 170 uses convention or fix abrasive material.

The polishing head 176 is generally supported above the polishing station 170 by the arm 180 of the carousel 174. The polishing head 176 is moved toward the platen 216 to press that substrate 120 against the polishing material during processing. In one embodiment, the polishing head 176 is a TITAN HEAD™ wafer carrier manufactured by Applied Materials, Inc., Santa Clara, Calif.

Figure 5A:
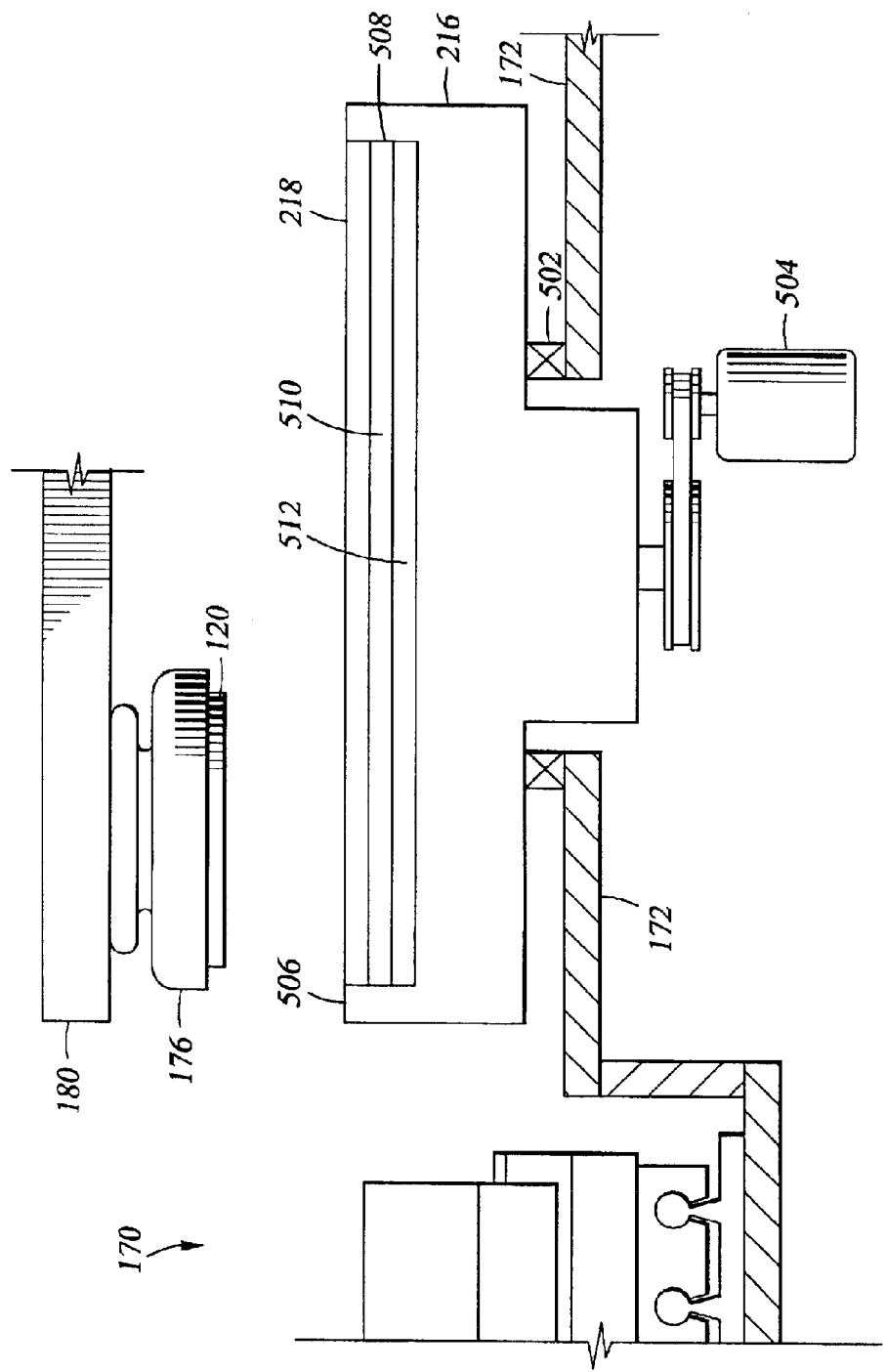
FIG. 5A depicts a sectional view of one embodiment of a polishing station.

FIG. 5A depicts a sectional view of the polishing station 170. The polishing station 170 generally includes the platen 216 that is rotatably disposed on the base 172. The platen 216 is typically comprised of aluminum. The platen 216 is supported above the base 172 by a bearing 502 so that the platen 216 may rotate in relation to the base 172. Conventional bearings, rotary unions and slip rings (not shown) are provided such that electrical, mechanical, pneumatic, control signals and connections may be coupled between the base 172 and the rotating platen 216. The platen 216 is typically coupled to a motor 504 disposed within the base 172 that provides rotational motion to the platen 216.

A top surface 506 of the platen 216 contains a center recess 508 extending into the platen 216. The platen 216 may optionally includes a plurality of passages (not shown) disposed adjacent to the recess 508. Fluid flowing through the passages may be used to control the temperature of the platen 216 and the polishing material 218 disposed thereon.

A subpad 510 and a subplate 512 are disposed in the center recess 508. The subpad 510 is typically a polymer, such as polycarbonate, foamed polyurethane or a combination of polymeric materials. Generally, the hardness or durometer of the subpad 510 may be chosen to produce a particular polishing result. The subpad 510 generally maintains the polishing material 218 parallel to the plane of the substrate 120 held in the polishing head 176 and promotes global planarization of the substrate. The subplate 512 is positioned between the subpad 510 and the bottom of the recess 508 such that the upper surface of the subpad 510 is coplanar with the top surface 506 of the platen 216. One polisher that may be adapted to benefit from the invention is a MIRRA® Chemical Mechanical Polisher, available from Applied Materials, Inc., located in Santa Clara, Calif. Another polisher that may be adapted to benefit is described in the previously incorporated U.S. Pat. No. 5,804,507 to Tolles.

Figure 5B:
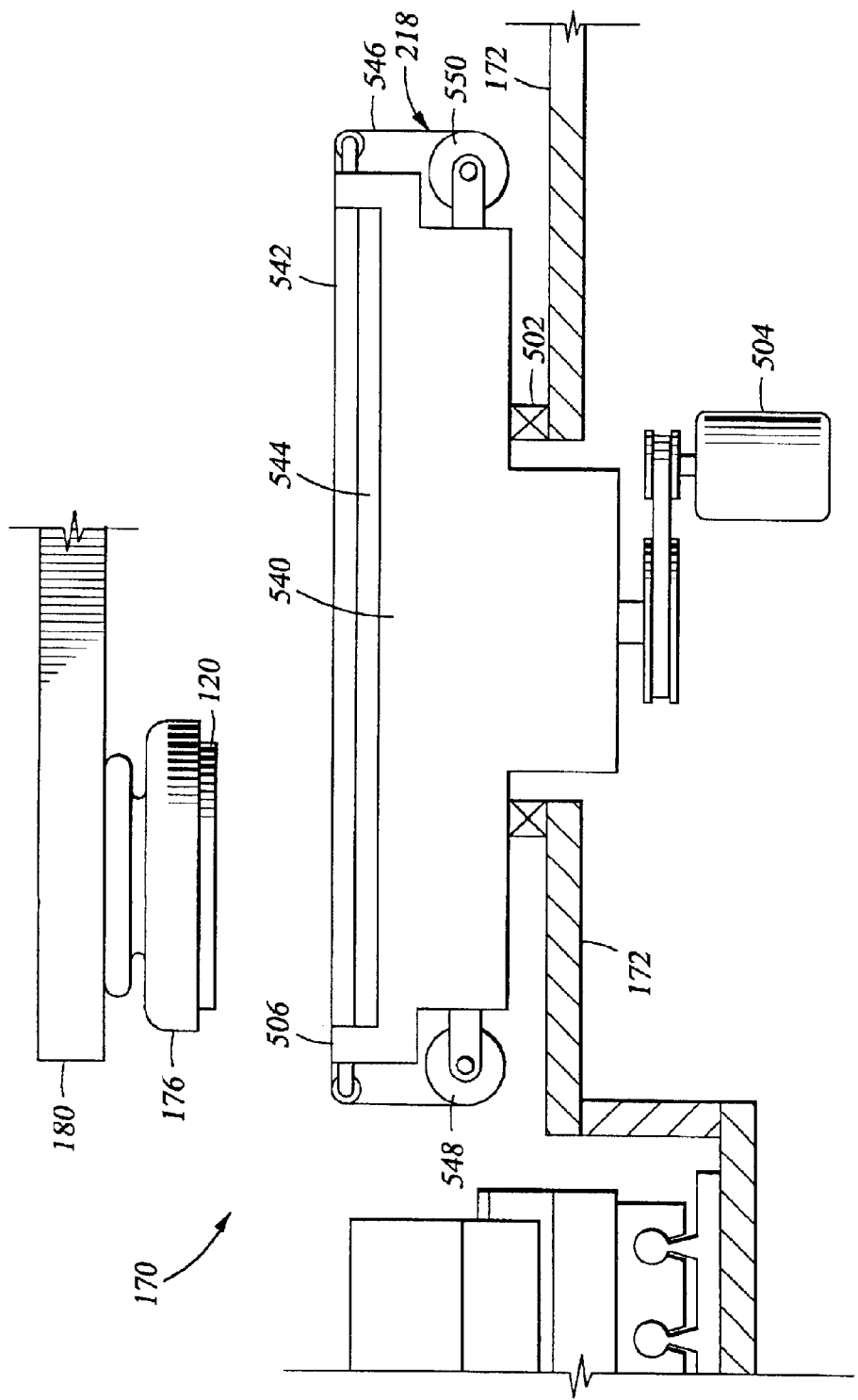
FIG. 5B depicts a sectional view of another embodiment of a polishing station.

In another embodiment, as seen in FIG. 5B, the polishing station 170 may alternatively comprise a web 546 of polishing material 218 that is partially disposed on a rotating platen 540. The web 546 is supported across the top surface 506 of the platen 540 between a supply roll 548 and a take-up roll 550. The web 546 may be selectively advanced across the platen 540 as the portion of web 546 used during processing is consumed. Generally, the polishing head 522 is pressed against the web 546 while the platen 540 rotates. Optionally, the polishing head 520 may oscillate in concert with the platen's rotation to provide a polishing pattern. One polisher that may be adapted to benefit from the invention is a REFLEXION™ Chemical Mechanical Polisher, available from Applied Materials, Inc. Another polisher that may be adapted to benefit is described in U.S. patent application Ser. No. 09/244,456, filed Feb. 4, 1999, by Birang et al., which is incorporated herein by reference in its entirety.

Figure 5C:
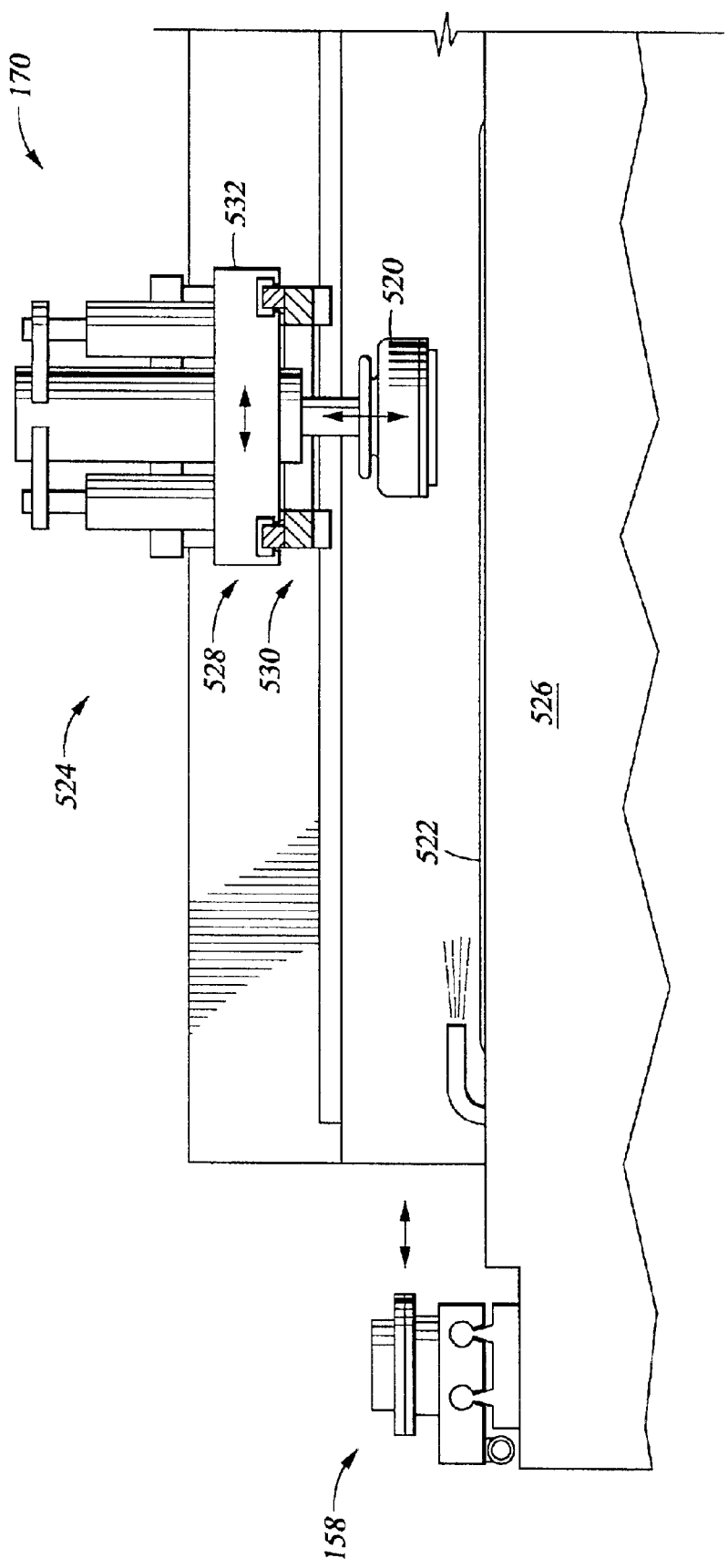
FIG. 5C depicts a sectional view of another embodiment of a polishing station.

In another embodiment, as seen in FIG. 5C, the polishing station 170 may alternatively comprise a polishing head 520 supported above a web 522 of polishing material by an x/y drive system 524. The drive system 524 is coupled to a base 526 that supports the web 522. Generally, the polishing head 522 is pressed against the web 522 while the drive system 524 moves the polishing head 520 in a polishing pattern. The drive system 524 typically includes a first linear motion device 528 and a second linear motion device 530. The first linear motion device is coupled to a stage that supports the polishing head. The first linear motion device 528 moves the stage 530 and polishing head 520 laterally across the width of the web 522. The second linear motion device 530 is coupled between the first linear motion device 528 and the base 526. The second linear motion device 530 moves the first linear motion device 528 (and hence the polishing head 520) along the length of the web 522. An example of such a polishing station that may be adapted to benefit from the invention is described in U.S. patent application Ser. No. 08/961,602, filed Oct. 31, 1997, by Sommer, which is incorporated herein by reference in its entirety.

Referring back to FIGS. 1A and 2, a first drive system 158 having a first load cup 160 coupled thereto is disposed adjacent to the second side 152 of the polisher 104. A second drive system 162 having a second load cup 164 coupled thereto is disposed to the third side 154 of the polisher 104. The drive systems 158, 162 generally provide x/y motion to the load cups 160, 164, respectively, along the sides 152, 154 of polisher 104, and inwardly from the sides 152, 154 towards the polisher's center. Generally, the drive systems 158, 162 enable the load cups to be moved around the polishing system 100 to facilitate efficient transfer of substrates to both the polishing heads 176 and the substrate handler 106. Other drive systems having a comparable range of motion may be substituted.

Figure 6:
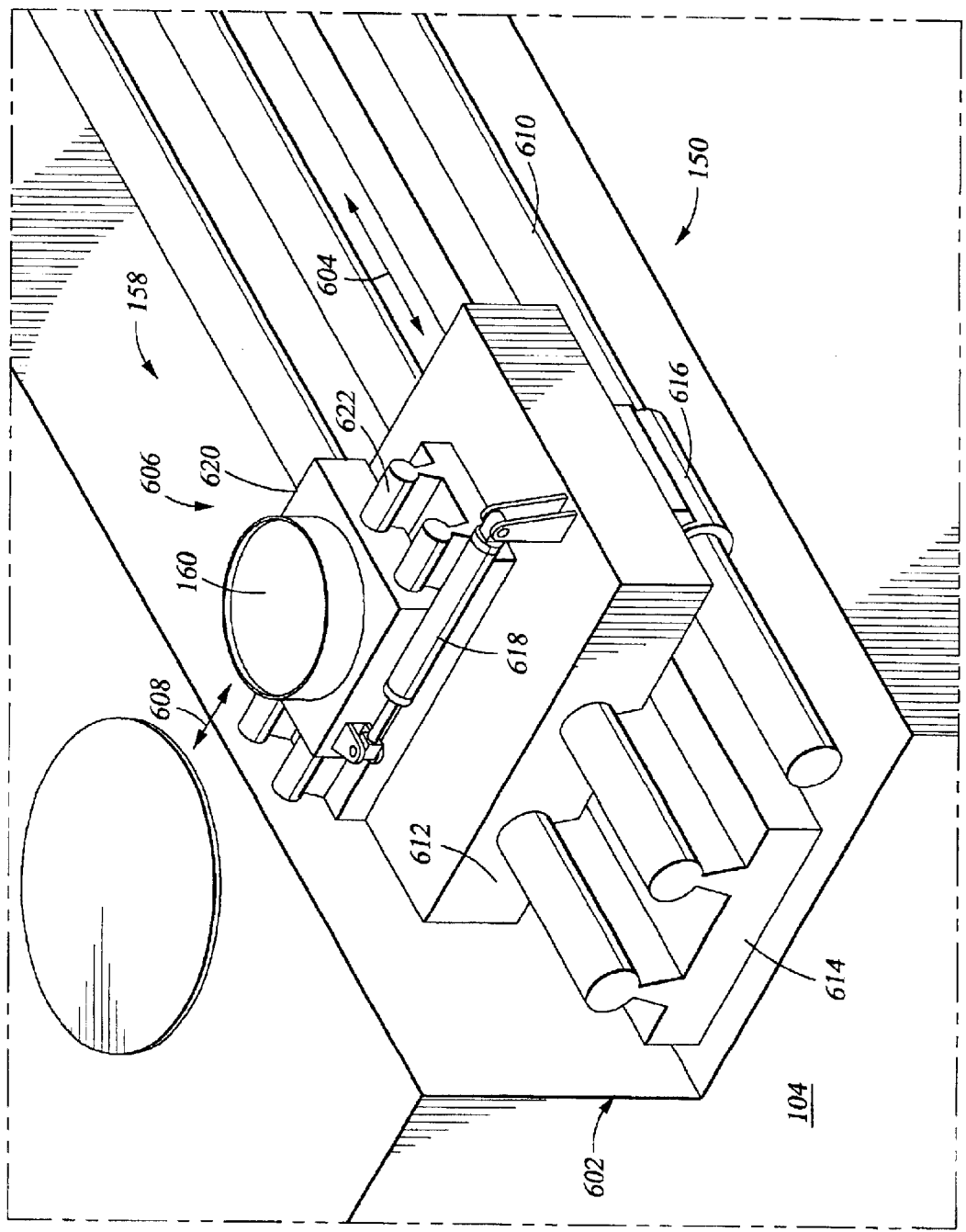
FIG. 6 depicts one embodiment of a load cup coupled to a drive system.

FIG. 6 depicts one embodiment of the first drive system 158. Generally, the drive system 158 comprises a first drive 602 that provides motion along a first axis (see arrow 604) and a second drive 606, coupled to the first drive 602, that provides motion along a second axis (see arrow 608). Optionally, a singular drive, such as a robot that can provide the combined motion may be substituted.

The first drive 602 generally includes a driver 610, a guide 612 and a rail 614. The rail 614 is coupled to the first side 150 of the polisher 104. The guide 612 is slidably coupled to the rail 614. The driver 610 generally controls the motion of the guide 612 along the rail 614. In one embodiment, the driver 610 is a rod-less cylinder that is coupled to the polisher 104. The driver 610 (i.e., cylinder) includes a carrier 616 that moves along the cylinder in response to a control signal. The carrier 616 is coupled to the guide 612 so that the cylinder controls the linear position of the guide relative to the second side 152 of the polisher 104. Alternatively, the driver 610 may be any motion device, such as a sawyer motor, a robot, a ball or lead screw, an elector-magnetic actuator, a pneumatic cylinder, a hydraulic cylinder, a motor (fluid or electric) and belt combination or other type of linear motion system.

The second drive 606 generally includes a driver 618, a guide 620 and a rail 622. The guide 620 supports the first load cup 160 and is slidably coupled to the rail 622. The driver 618 generally controls the motion of the guide 620 along the rail 622. In one embodiment, the driver 618 is a pneumatic cylinder that is coupled between the guide 612 of the first drive 602 and the guide 620 of the second drive 606. The cylinder moves the guide 620 and load cup 160 inwardly towards the polisher's center relative the second side 152 of the polisher 104. Alternatively, the driver 618 may be any motion device, such as a sawyer motor, a robot, a ball or lead screw, an elector-magnetic actuator, a rod-less cylinder, a hydraulic cylinder, a motor (fluid or electric) and belt combination or other type of linear motion system.

Typically, the motion provided by the first drive 602 and the second drive 604 of the first drive system 158 are perpendicular to each other. The second drive system 162 is similarly configured along the third side 154 of the polisher 104.

Generally, the load cups 160, 162 are configured to facilitate accurate transfer of the substrate 120 to the polishing head 176 without damaging the substrate. Typically, the load cups 160, 162 retains the substrate while aligning the substrate 120 to the respective polishing head to minimized potential substrate damage transfer.

Figure 7:
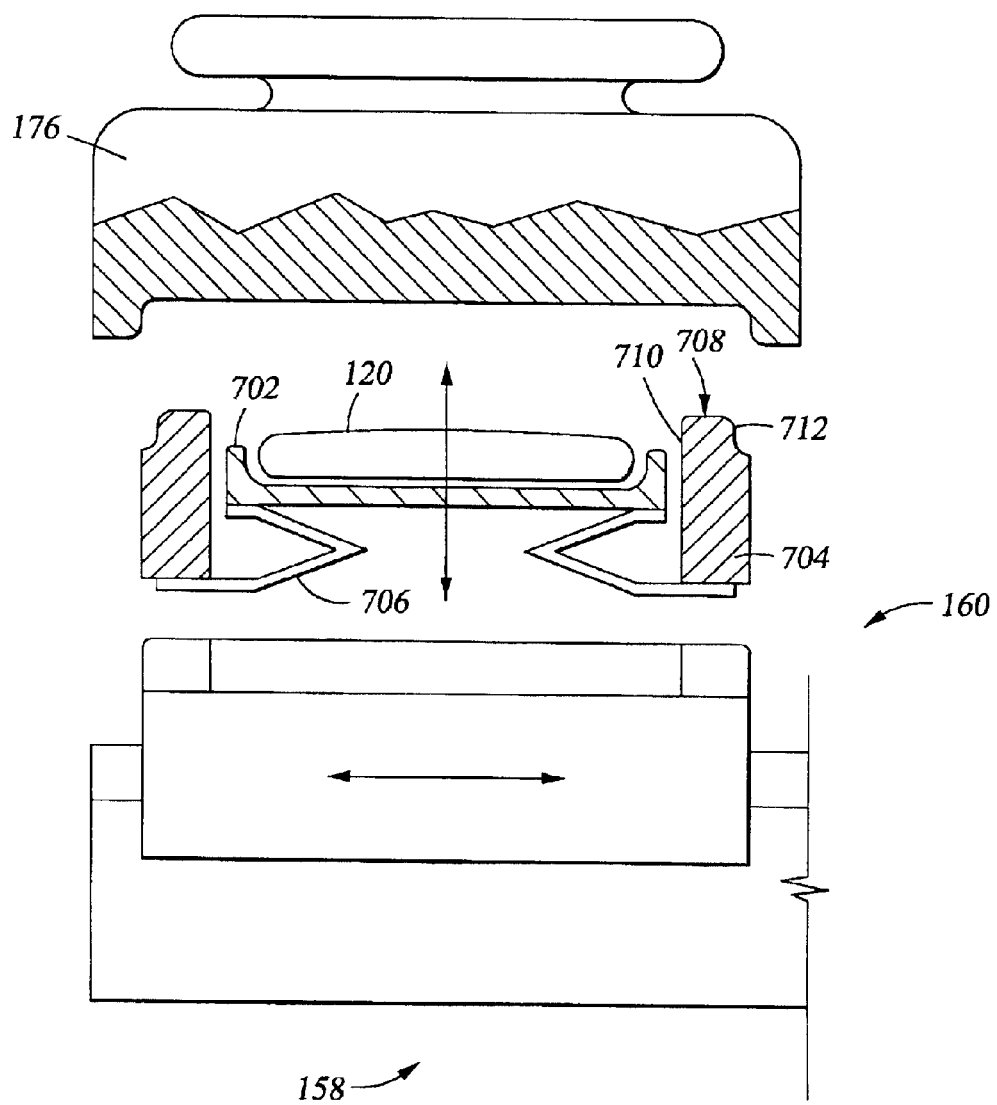
FIG. 7 depicts an exploded view of one embodiment of a load cup.

FIG. 7 depicts one embodiment of the first load cup 160. The load cup 160 generally includes a chuck 702, a cone 704 and a flexure 706. The cone 702 has a lip 708 that includes an inner portion 710 and an outer portion 712. The inner portion 710 centers the substrate 120 within the cone 704 while the outer portion 712 aligns the load cup 160 relative to the polishing head 176 during substrate transfer. The chuck 702 is disposed within the load cup 700 and is coupled to the cone 704 by the flexure 706. The chuck 602 supports the substrate 120 within the load cup 160. The flexure 606 permits the chuck 702 to concentrically raise the substrate 120 into the polishing head 176 after the cone 604 and polishing head 176 mate. An example of such a load cup is described in U.S. patent application Ser. No. 09/414,907, filed Oct. 8, 1999, by Tobin, which is hereby incorporated herein by reference in its entirety.

Figure 8:
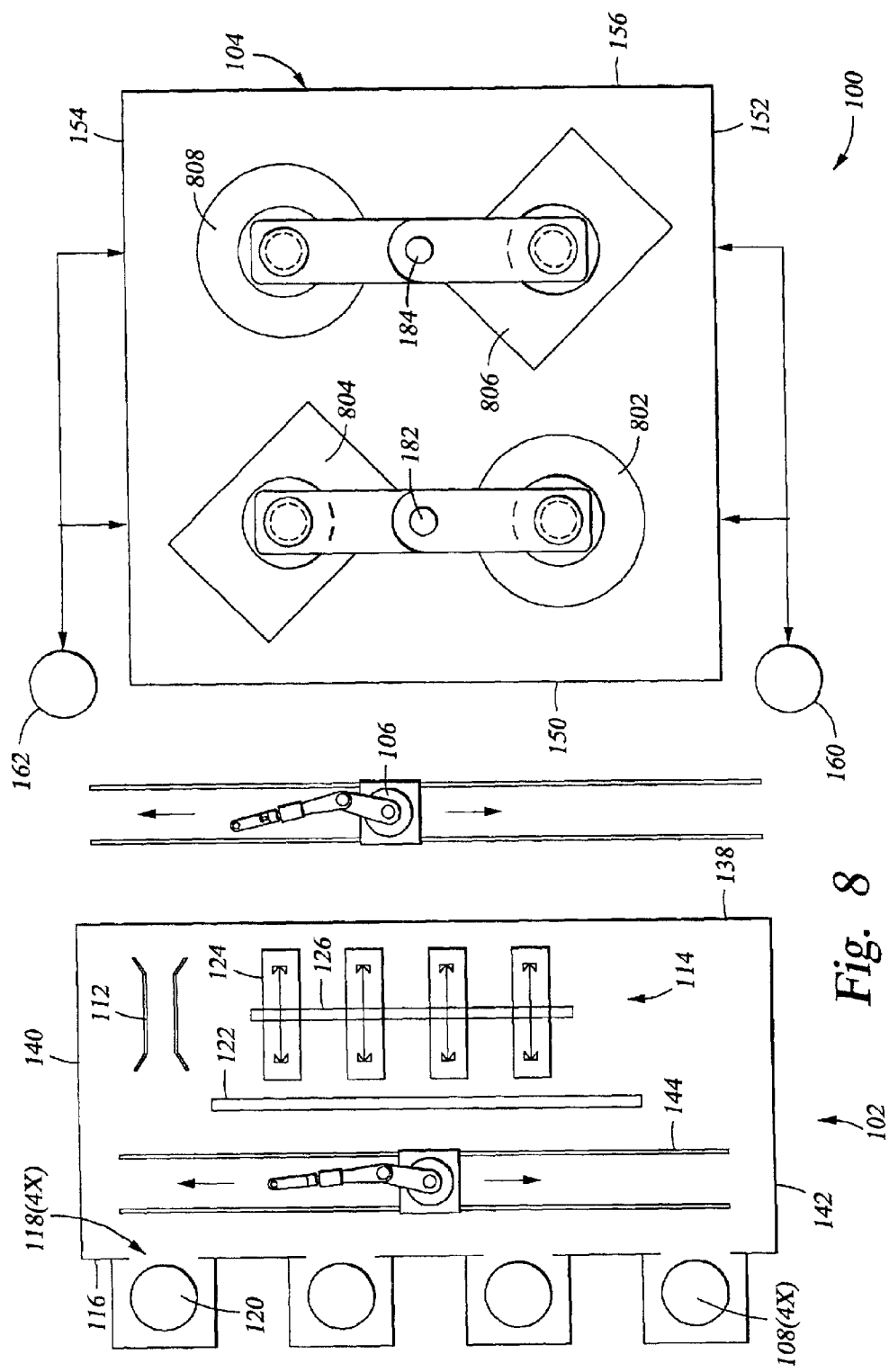
FIG. 8 depicts a schematic illustrating one embodiment of a mode of operation for the polishing system of FIG. 1A.

FIG. 8 depicts an exemplary mode of operation through which the system 100 may be utilized. The representative mode is provided by way of example and does not represent exclusively the way through which the system 100 may be utilized. In one embodiment of a mode of operation, a first substrate is transferred to the polisher 104 by the first load cup 160 while a second substrate is simultaneously transferred to the polisher 104 by the second load cup 162. Typically, the first substrate is processed at a first polishing station 802 disposed proximate the second side 152 then transferred by the carousel 182 to a second polishing station 804 disposed proximate the third side 154. After processing is complete at the third side 154, the first substrate is removed from the polisher 104 by the second load cup 162 and returned to the substrate storage cassettes 108 after cleaning.

The second substrate is process simultaneously in parallel to the processing of the first substrate. Generally, the second substrate is processed in a third polishing station 806 disposed proximate the third side 154 of the polisher 104 then transferred by the carousel 184 to a fourth polishing station 808 disposed proximate the second side 152 of the polisher 104. After processing is complete at the fourth polishing station 808, the second substrate is removed by the first load cup 160 and returned to the substrate storage cassettes 108 after cleaning. Thus, throughput is increased because each substrate is sequentially processed through multiple polishing stations while being retained in one polishing head. Moreover, two carousels 182 and 184 and their respective adjacent polishing stations permit parallel processing of substrates to occur simultaneously.

In another mode of operation, both the first and second substrate are transferred to the polisher 104 by the first load cup 160. The first substrate is processed at the first then second polishing stations 802, 804 while the second substrate is processed in parallel at the fourth then third polishing station 808, 806. After processing, both the first and second substrates are removed from the polisher 104 by the second load cup 162.

In yet another mode of operation, a third and fourth substrate are simultaneously processed in parallel to the first and second substrate. Generally, as the first and second substrates are transferred to the first and fourth polishing station 802, 808 by the first load cup 160, the third and fourth substrates are transferred to the second and third polishing station 804, 806 by the second load cup 162. As the first and third substrate complete processing, they swapped between the first and second polishing station 802, 804 by the carousel 182. After processing is completed, the first substrate is removed from the polisher 104 by the second load cup 162 while the second substrate is removed from the polisher 104 by the first load cup 160. The second and fourth substrates are similarly processed. Other processing modes may alternatively be configured to process the substrate as desired.

The utilization of mobile load cups (i.e., load cups 160, 164 coupled to drive systems 158 and 162) allows for greater flexibility of process sequences. Furthermore, the routing of substrates utilizing simultaneous operation of the load cups 160, 164 and polishing heads 176 allows for greater system throughput.

In another mode of operation, the substrate 120 retained in the polishing head 176 and processed on the first polishing station 808 may be transferred to the third polishing station 822 for further processing. After processing, the substrate 120 is removed from the polisher 104 by the second load cup 164. In this configuration, substrates 120 loaded on the polisher 104 on the second side 152 are removed from the polisher 104 from the third side 154. Likewise, substrates 120 loaded on the polisher 104 from the third side 154 may be removed from the polisher 104 from the second side 152. Other modes of operation may be configured to utilize the polishing stations 170 in alternative sequences, along with varying the handling sequence (i.e., which load cups are utilized to load and unload a particular polishing head) through the polisher 104.

Figure 9:
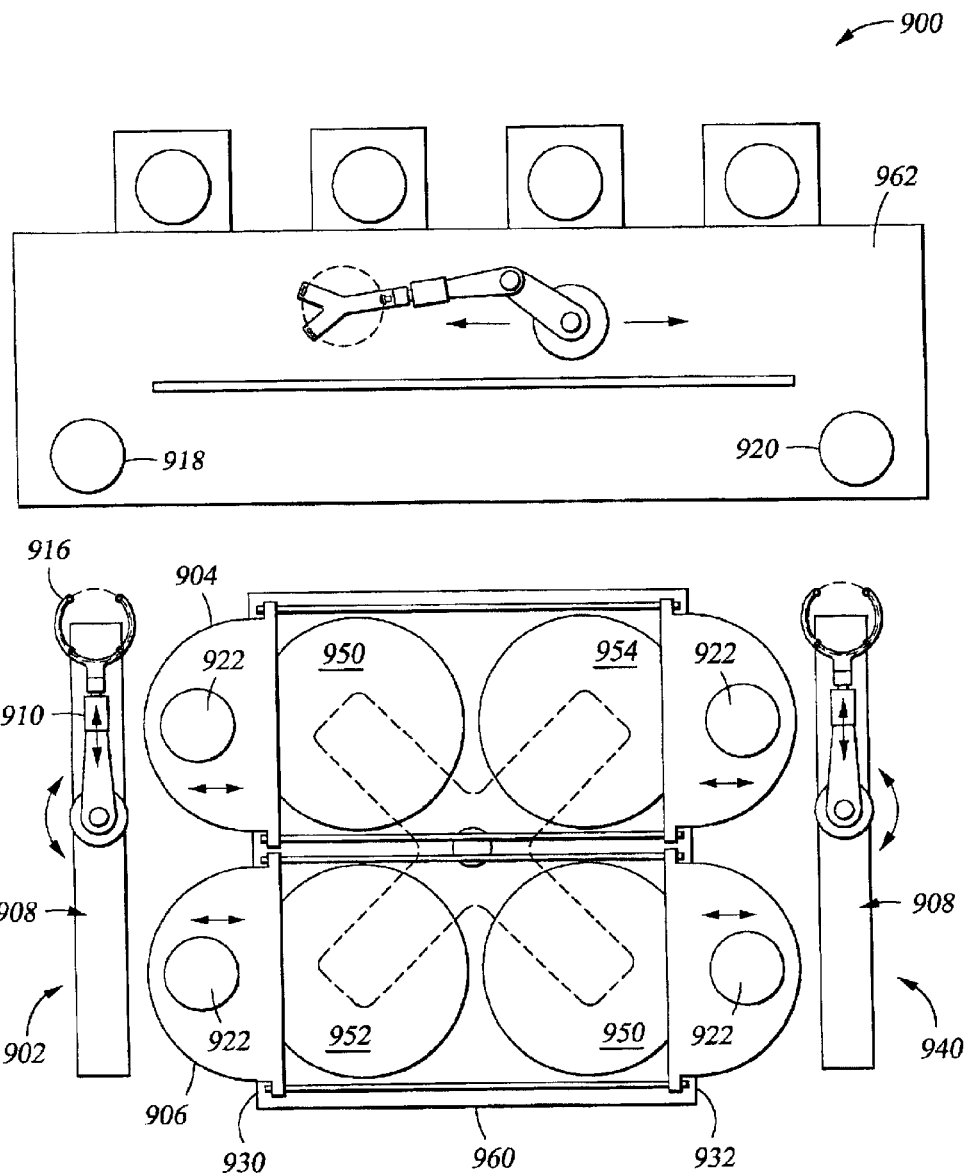
FIG. 9 is a plan view of another embodiment of a chemical mechanical polishing system of the invention.

FIG. 9 depicts a plan view of another embodiment of a chemical mechanical polishing system 900 having a first drive system 902 and a second drive system 940 disposed on opposing sides of the system 900. Generally, the system 900 is substantially similar to the system 100 described with reference to FIGS. 1A and 2 except that the drive systems 902 and 940 includes a first shuttle table 904, a second shuttle table 906 and a wafer transfer corridor 908.

Generally, the system 900 includes a polisher 960 and a front end 962 disposed adjacent thereto. The polisher 960 has a first side 930 and an opposing second side 932. A first polishing station 950 and a second polishing station 952 are disposed on the first side 930 of the polisher 960 and are adjacent the wafer transfer corridor 908 of the first drive system 902. A third polishing station 954 and a fourth polishing station 956 are disposed on the second side 930 of the polisher 960 and are adjacent the wafer corridor 908 of the second drive system 940.

Generally, the wafer transfer corridor 908 of the first drive system includes a transfer robot 910 that is positionable along the first side 930 of the polisher 960. The transfer robot 910 has a gripper 916 that is capable of receiving a substrate from a first input module 918 of a factory interface 962. After receiving the substrate, the transfer robot 910 moves to adjacent the first shuttle table 904 while rotating the gripper 916 90 degrees to align the substrate with a load cup 922 disposed in the first shuttle table 904. The transfer robot 910 then returns to the first input module 918 to receive another substrate that is loaded in the second shuttle table 908.

The first shuttle table 904 with the substrate disposed within the load cup 922, moves inward from the first side 930 of the polisher 960 to the first polishing station 250. The first shuttle table 904 is position below a polishing head (not shown) so that the substrate may be transferred thereto. The first shuffle table 904, now free of the substrate, moves clear of the first polishing station 950 so that the substrate may be processed. The second shuttle table 906 similarly loads a polishing head (not shown) of the second polishing station 952.

The second drive system 940 disposed on the second side 930 of the polisher 960 similarly transfers substrates from a second input module 920 disposed in the front end 962 to the third polishing station 954 and the fourth polishing station 956.

Figure 10:
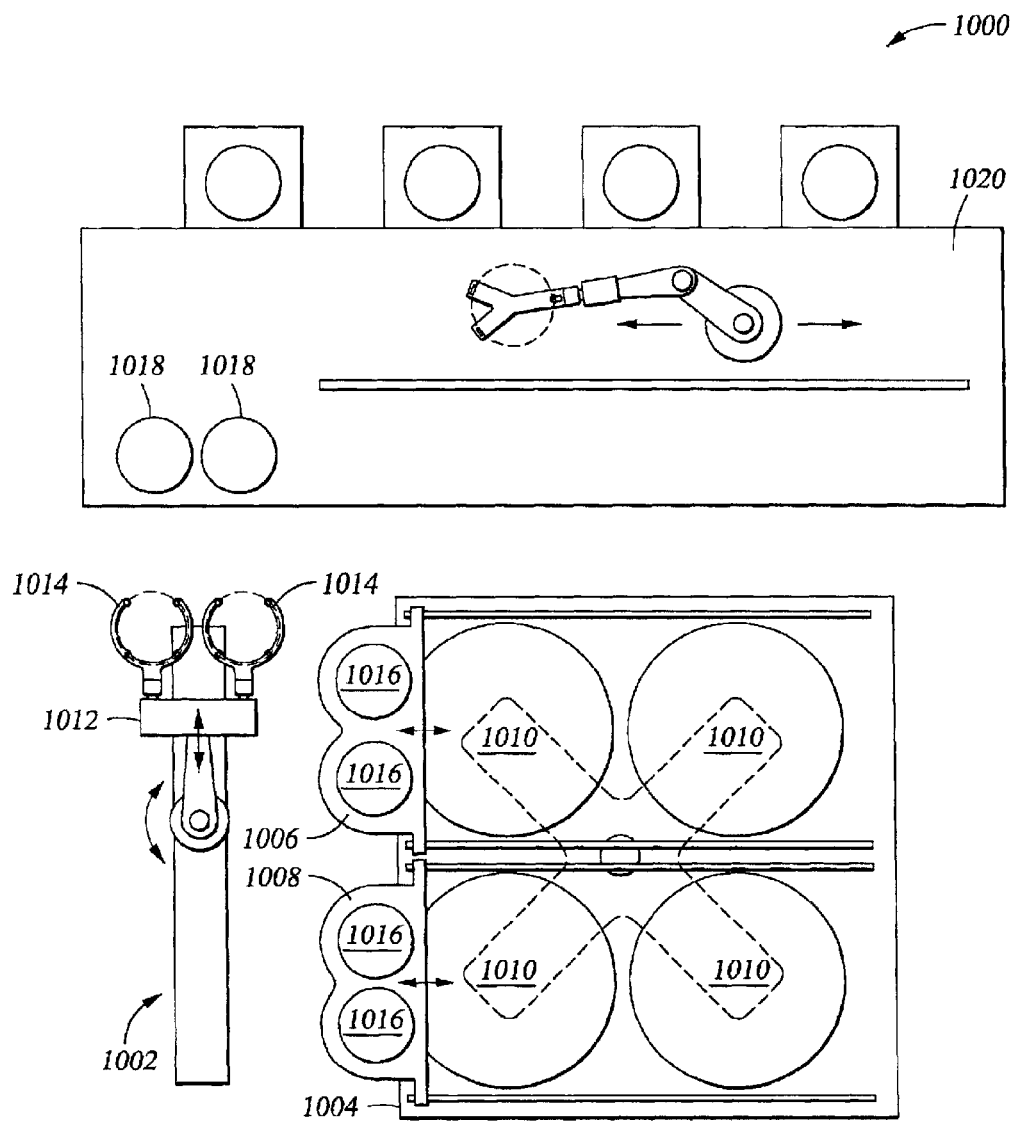
FIG. 10 is a plan view of another embodiment of a chemical mechanical polishing system of the invention.

FIG. 10 depicts a plan view of another embodiment of a chemical mechanical polishing system 1000 having a drive system 1002 disposed on a first side 1004 of the system 1000. Generally, the system 1000 is substantially similar to the system 900 described with reference to FIG. 9 except that shuttle tables 1006 and 1008 of the drive system 1002 can traverse the travel between polishing stations 1010 on both sides of the system 1000.

The shuttle tables 1006 and 1008 may include more than one load cup 1016 such that the polishing stations 1010 may be loaded sequentially without interfacing with a robot 1012 that loads the shuttle tables 1006 and 1008. Alternatively, two load cups 1016 disposed on each shuttle table 1006 and 1008 may be utilized to receive a process substrate in one load cup and transfer an unprocessed substrate from the other load cup to a polishing head (not shown) while positioned at one of the polishing stations 1010. To facilitate transfer of substrates to the multiple load cups 1016 on each shuttle table, the transfer robot 1012 coupled to the drive system 1002 may include two grippers 1014, each configured to hold a substrate. Additionally, two input modules 1018 may be disposed in a front end 1020 of the system 1000 to accommodate transfer of more than one substrate with the robot 1012.

Although the teachings of the present invention that have been shown and described in detail herein, those skilled in the art can readily devise other varied embodiments that still incorporate the teachings and do not depart from the scope and spirit of the invention.

What is claimed is:

1. A system for processing a substrate comprising:
   a polisher having one or more polishing heads and at least a first platen and a second platen, the polishing heads adapted to retain the substrate against the platens during processing and providing motion therebetween;
   a load cup adapted to transfer the substrate to at least one of the polishing heads;
   a first motion device disposed proximate a first side of the polisher movable along the first side between at least a first position adjacent the first platen and a second position adjacent the second platen; and
   a second motion device coupled to the first motion device and the load cup, the second motion device movable by the first motion device, the second motion device moving the load cup relative to the first motion device between at least a first position not accessible by the polishing head and adjacent the first side, and a second position accessible by the polishing head and inward of the first side.

2. The system of claim 1, wherein the first motion device moves substantially perpendicular to the second motion device.

3. The system of claim 1, wherein the first motion device comprises a lead screw, a ball screw, a belt, a cylinder, a solenoid, a sawyer motor or a linear actuator.

4. The system of claim 1 further comprising a substrate handler for transferring substrates to the load cups.

5. The system of claim 4, wherein the substrate handler further comprises an edge contact substrate gripper, a robot and a rotary actuator coupling the gripper to the robot.

6. The system of claim 5 further comprising:
   a factory interface, wherein the substrate handler transfers substrates between the factory interface and the load cup.

7. The system of claim 6 further comprising:
   a plurality of substrate storage cassettes coupled to the factory interface.

8. The system of claim 6 further comprising a cleaner disposed in the factory interface.

9. The system of claim 6 further comprising an input module disposed in the factory interface proximate the polisher.

10. The system of claim 9, wherein the input module is adapted to retain the substrate in a vertical position.

11. The system of claim 6 further comprising:
    a plurality of substrate storage cassette coupled to the factory interface;
    an input module disposed in the factory interface proximate the polisher; and
    a factory interface robot for transferring substrates between the input module and the storage cassettes.

12. The system of claim 1 further comprising:
    a third motion device disposed proximate a second side of the polisher, the third motion device moving along the second side between at least a first position and a second position;
    a second load cup; and
    a fourth motion device coupled to the third motion device and the second load cup, the fourth motion device moving the second load cup between at least a first position proximate the second side and a second position inward of the second side.

13. The system of claim 12, wherein the first side of the polisher is opposite the second side of the polisher.

14. The system of claim 12, wherein the one or more platens comprises two platens.

15. The system of claim 12, wherein the one or more platens comprises four platens.

16. The system of claim 15, wherein two platens comprise a buffing station and two platens comprise a polishing station.

17. The system of claim 12 further comprising a polishing pad disposed on at least one of the platens.

18. The system of claim 12 further comprising a polishing web disposed on at least one of the platens.

19. The system of claim 12 further comprising a carousel disposed between the platens and supporting the polishing heads.

20. The system of claim 15 further comprising:
    a first drive system coupled to the polisher and supporting a first pair of polishing heads; and
    a second drive system coupled to the polisher and supporting a second pair of polishing heads.

21. A system for processing a substrate comprising:
    a polisher having one or more polishing heads and one or more platens, the polishing heads adapted to retain the substrate against the platens during processing and providing motion therebetween;

a first motion device disposed adjacent a first side of the polisher, the first motion device being movable along the first side of the polisher;

a first load cup coupled to the first motion device;

a second motion device disposed adjacent a second side of the polisher, the second motion device being movable along the second side of the polisher the second side being opposite the first side of the polisher; and a second load cup coupled to the second motion device.

22. The system of claim 21, wherein the first motion device further comprises a third motion device coupled to the first load cup, the third motion device adapted to move the first load cup between a first position proximate the first side of the polishing and a second inward position.

23. The system of claim 22, wherein the second motion device further comprises a fourth motion device coupled to the second load cup, the fourth motion device adapted to move the second load cup between a first position proximate the second side of the polishing and a second inward position.

24. The system of claim 21 further comprising a substrate handler disposed on a third side of the polisher.

25. The system of claim 24 further comprising:

a plurality of substrate storage cassettes coupled to the factory interface;

an input module disposed in the factory interface proximate the third side of the polisher; and a factory interface robot for transferring substrates between the input module and the storage cassettes.

26. The system of claim 25, wherein the input module is adapted to retain the substrate in a vertical position.

27. The system of claim 24, wherein the substrate handler further comprises an edge contact substrate gripper, a robot and a rotary actuator coupling the gripper to the robot.

28. The system of claim 21 further comprising a cleaner disposed proximate a third side of the polisher.

29. The system of claim 21, wherein the one or more platens comprises two platens.

30. The system of claim 21, wherein the one or more platens comprises four platens.

31. The system of claim 30, wherein two platens comprise a buffing station and two platens comprise a polishing station.

32. The system of claim 21 further comprising a polishing pad disposed on at least one of the platens.

33. The system of claim 21 further comprising a polishing web disposed on at least one of the platens.

34. The system of claim 21 further comprising a carousel disposed between the platens and supporting the polishing heads.

35. The system of claim 21, wherein the first motion device comprises a lead screw, a ball screw, a cylinder, a solenoid, a sawyer motor or a linear actuator.

36. A system for processing a substrate comprising:

a polisher having one or more polishing heads and one or more platens, the polishing heads adapted to retain the substrate against the platens during processing, the platens and polishing heads having a relative motion therebetween;

a first motion device disposed adjacent a first side of the polisher, the first motion device being movable along the first side of the polisher;

a first load cup coupled to the first motion device;

a second motion device disposed adjacent a second side of the polisher, the second motion device being movable along the second side of the polisher, the second side being opposite the first side of the polisher;

a second load cup coupled to the second motion device; and a substrate handler disposed proximate a third side of the polisher.

37. The system of claim 36, wherein the first motion device further comprises:

a third motion device coupled to the first load cup, the third motion device adapted to move the first load cup between a first position proximate the first side of the polishing and a second inward position; and wherein the second motion device further comprises a fourth motion device coupled to the second load cup, the fourth motion device adapted to move the second load cup between a first position proximate the second side of the polishing and a second inward position.

38. The system of claim 37, wherein the one or more platens comprises four platens.

39. The system of claim 21 further comprising a polishing pad or a polishing web disposed on at least one of the platens.

40. A system for processing substrates comprising:

a polisher having a first drive system and a second drive system, each drive system having at least one polishing head coupled thereto;

a first motion device coupled to a first side of the polisher, the first motion device comprising:

a substrate gripper movably disposed along the first side of the polisher;

at least one shuttle table having one or more load cups adapted to transfer substrates between the gripper and the polishing head of the first drive system; and a second motion device coupled to a second side of the polisher, the second motion device comprising:

a substrate gripper movably disposed along the first side of the polisher;

at least one shuttle table having one or more load cups adapted to transfer substrates between the gripper and the polishing head of the second drive system.

41. A system for processing a substrate comprising:

a polisher having one or more polishing heads and one or more platens, the polishing heads adapted to retain the substrate against the platens during processing and providing motion therebetween;

a first motion device disposed proximate a first side of the polisher movable along the first side between at least a first position and a second position;

a second motion device coupled to and movable by the first motion device, the second motion device independently movable between at least a first position not accessible by the polishing heads and adjacent the first side, and a second position accessible by the polishing heads and inward of the first side;

a first load cup coupled to the second motion device, wherein the first load cup is adapted to transfer the substrate to at least one of the polishing heads;

a third motion device disposed proximate a second side of the polisher movable along the second side between at least a first position and a second position;

a fourth motion device coupled to and movable by the third motion device, the fourth motion device independently movable between at least a first position adjacent the second side and a second position inward of the second side; and a second load cup coupled to the fourth motion device, wherein the second load cup is adapted to transfer the substrate to at least one of the polishing heads.

42. The system of claim 41, further comprising:

a factory interface; and a substrate handler for transferring substrates between the factory interface and the first load cup, wherein the substrate handler comprises:
  an edge contact substrate gripper;
  a robot; and
  a rotary actuator coupling the gripper to the robot.

43. The system of claim 42, further comprising:

a plurality of substrate storage cassette coupled to the factory interface;

an input module disposed in the factory interface proximate the polisher; and a factory interface robot for transferring substrates between the input module and the storage cassettes.

44. The system of claim 41 further comprising a polishing pad or a polishing web disposed on at least one of the platens.

45. The system of claim 41 further comprising a carousel disposed between the platens and supporting the polishing heads.

46. The system of claim 41, wherein the one or more platens comprises four platens.

47. The system of claim 46, wherein two platens comprise a buffing station and two platens comprise a polishing station.

48. The system of claim 46 further comprising:

a first drive system coupled to the polisher and supporting a first pair of polishing heads; and a second drive system coupled to the polisher and supporting a second pair of polishing heads.

* * * * *